United States Patent [19]

Bowen

[11] Patent Number: 4,744,671
[45] Date of Patent: May 17, 1988

[54] INSTRUMENT FOR MEASURING ELECTRIC CURRENT

[76] Inventor: John G. Bowen, Valley View Cottage, Newgrounds, Godshill, Fordingbridge, Hampshire, England

[21] Appl. No.: 25,668

[22] Filed: Mar. 13, 1987

[51] Int. Cl.$^4$ .......................................... G01K 11/06
[52] U.S. Cl. .................... 374/160; 116/217; 374/210
[58] Field of Search ............... 374/160, 161; 350/351; 116/217

[56] References Cited

U.S. PATENT DOCUMENTS

| | | | |
|---|---|---|---|
| 1,623,666 | 4/1927 | Ferkel | 374/161 |
| 3,067,312 | 12/1962 | McFarlane | 374/160 |
| 3,125,984 | 3/1964 | Okuyama | 116/217 X |
| 3,576,129 | 4/1971 | Crites | 374/161 |
| 4,092,625 | 5/1978 | Newson | 337/405 |
| 4,118,667 | 10/1978 | Milligan | 116/217 X |
| 4,298,794 | 11/1981 | Snitzer et al. | 374/161 |

Primary Examiner—Daniel M. Yasich
Attorney, Agent, or Firm—Keith D. Beecher

[57] ABSTRACT

A simple and inexpensive instrument for measuring electric current that may be mounted on existing current-carrying conductors to provide a ready visible indication of the current flowing through the conductor. The instrument comprises an outer transparent tube mounted coaxially with the current-carrying conductor, a number of O-rings mounted within the tube and spaced along the length of the tube to form different compartments along the instrument, and a number of differently colored tubular indicators respectively forming the inner walls for the compartments, with each compartment being filled with a material, such as paraffin wax, which melts at a different temperature from the material in the other compartments, to become transparent and reveal the corresponding colored inner indicator, when the current in the conductor heats the conductor to a particular temperature.

5 Claims, 1 Drawing Sheet

INSTRUMENT FOR MEASURING ELECTRIC CURRENT

BACKGROUND OF THE INVENTION

Temperature measuring devices using materials that melt at different temperatures are known. Such devices have been used for the most part as disposable clinical thermometers. For example, one type of such prior art temperature measuring device, as described in U.S. Pat. No. 3,859,856, uses a backing member and several layers of chemicals disposed in compartments on the backing member. The layers of chemicals consist of first and third layers normally separated by a second layer in each compartment. The chemicals forming the second layer have characteristics for melting at a different known temperature for each compartment. In response to the melting of the chemicals in the second layer, the chemicals in the first and third layers mix and react to form a particular color. The backing member is provided with indicia adjacent the respective compartments representative of the melting temperature of the chemical in the second layer of the associate compartment. With these devices, the sensed temperatures ascertained by reading the highest number of the indicia corresponding to the compartments having the particular color.

These prior art devices have been used primarily with human beings to measure body temperatures which generally vary within a range of 95° Fahrenheit and 105° Fahrenheit.

The present invention provides a simple temperature sensor which is used to measure the electric current flowing through a conductor by measuring the temperature of the conductor. It is well known that due to its inherent resistance, a conductor carrying an electric current increases in temperature as the current increases. The instrument of the invention has a feature in that it is inherently simple in its construction and may be manufactured economically and sold at a relatively low price.

The embodiment of the invention to be described is one in which a series of compartments are provided along a current-carrying conductor, with each compartment being filled with a solid material, such as wax, that melts at different temperatures for different compartments. The material in each compartment is normally solid. However, when the temperature of the conductor which varies with the current flowing through the conductor reaches a particular level, the wax in one of the compartments melts, and becomes transparent. This enables the inner wall of the particular compartment to become visible, and to display a particular color. Then, for different currents, the wax in different compartments melts, so the back walls are displayed. The instrument may be calibrated in amperes when used to measure currents for different loads when the voltage is constant; or it may be calibrated in volts when the load is constant and the voltage changes.

The instrument of the invention has widespread application for both home and industrial use, for providing a simple means for indicating the temperature of a current carrying conductor, to provide an indication of the current flowing through the conductor, particularly to indicate when the current is approaching or has exceeded a danger level.

DETAILED DESCRIPTION OF THE ILLUSTRATED EMBODIMENT

Figure 1:
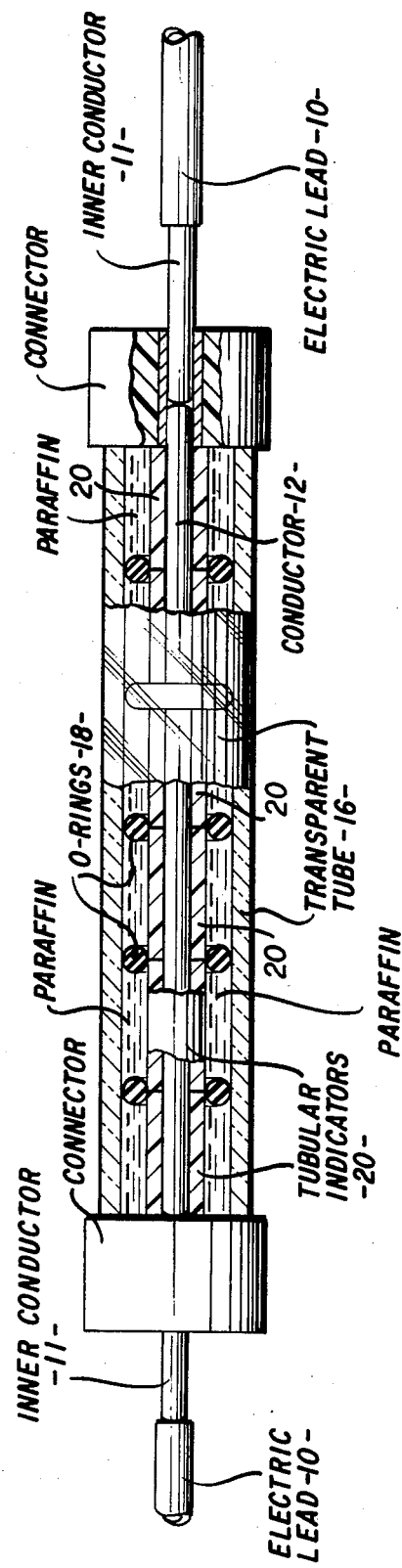
FIG. 1 shows an instrument constructed in accordance with one embodiment of the present invention and mounted on an electric current-carrying conductor to measure the current.

The instrument of the invention is shown in FIG. 1 mounted on an electric conductor 12 which is connected as a shunt to the inner conductor 11 of an electric lead 10.

The instrument includes an outer transparent tubular member 16 which is mounted in coaxial relationship about the conductor 12, and radially spaced outwardly from the conductor. A number of O-rings 18 are mounted coaxially with the conductor 12; and they are spaced along the conductor to form separate compartments, the O-rings being visible through the outer tubular member 16 as shown in FIG. 1.

A number of opaque indicators 20 are mounted coaxially about the conductor 12 and are located in the respective compartments formed by the O-rings 18. The opaque indicators are radially spaced inwardly from the transparent tube 16, so that the transparent tube forms an outer wall for the compartments, and the opaque indicators 20 form respective inner walls for the compartments. The opaque indicators may be formed, for example, by painting or otherwise forming opaque coatings on conductor 12. Each of the compartments is filled with a selected material, such as wax, which melts at a different temperature insofar as each compartment is concerned. Other materials also may be used, such as the temperature indicating compositions described in U.S. Pat. No. 3,946,612.

The material in the different compartments may be selected to melt at different temperatures. Accordingly, when an electric current flows through conductor 12, the material in successive compartments will melt, revealing the inner opaque indicators 20 through the outer transparent tube 16, as the solid material within the various compartments changes from an opaque state to a transparent molten state. Accordingly the number of inner opaque indicators 20 revealed through the transparent outer tube 16 will correspond to the temperature of the conductor 12 which, in turn, is a function of the current flowing through the conductor. The inner opaque indicators 12 may have a distinctive color, such as red, to be readily visible. Alternately, the indicators 20 may have voltage or current calibrations, or any other inscriptions formed on them, which become visible as the solid material between them and the outer transparent tubular member 16 melts.

The invention provides, therefore, a simple and inexpensive instrument for home or industrial use, which is capable of providing readily visible indications relating to the current flow through a conductor. The instrument has particular utility for indicating electric overloads, or whether any particular electric circuit is active or inactive.

It will be appreciated that while a particular embodiment of the invention has been shown and described, modifications may be made. It is intended in the claims to cover all modifications which come within the true spirit and scope of the invention.

I claim:

1. An instrument for displaying indications of an electric current flowing through a conductor, including: a transparent tubular member surrounding the conductor in coaxial relationship therewith and spaced radially from said conductor; a plurality of annular separators mounted between the conductor and the transparent tubular member and axially spaced along the conductor to form individual compartments, with said transparent tubular member forming the outer wall of said compartments; a plurality of tubular indicators surrounding said conductor in coaxial relationship therewith and positioned between successive pairs of said annular separators, and forming inner walls for said compartments; and an opaque solid material contained in each of said compartments and having a melting point different from the melting point of the material in the other compartments, to melt and become transparent at a particular temperature so as to reveal the corresponding tubular indicator through said transparent tubular member.

2. The instrument defined in claim 1, in which the opaque solid material in each successive compartment has a successively higher melting point than the material in the preceding compartment.

3. The instrument defined in claim 1, in which said tubular indicators are formed of an opaque material.

4. The instrument defined in claim 1, in which said opaque solid material comprises wax, the wax in each compartment having a different melting point than the paraffin in the other compartments.

5. An instrument for displaying an indication of an electric current flowing through a conductor, including: a transparent outer tubular member surrounding the conductor in coaxial relationship therewith and spaced radially therefrom; at least two annular separators mounted between said conductor and said transparent tubular member and axially spaced along said conductor to form at least one compartment, with said transparent tubular member forming the outer wall of said compartment; at least one tubular indicator surrounding said conductor in coaxial relationship therewith and positioned between said annular separators, and forming an inner wall for said compartment; and an opaque solid material contained in said compartment to melt and become transparent at a particular temperature to reveal the tubular indicator through said transparent tubular member.

* * * * *